United States Patent
Guo et al.

(10) Patent No.: US 8,254,389 B2
(45) Date of Patent: Aug. 28, 2012

(54) APPARATUS AND METHOD FOR INTER-OFFICE COMPRESSION

(75) Inventors: Katherine H. Guo, Scotch Plains, NJ (US); Scott C. Miller, Freehold, NJ (US)

(73) Assignee: Alcatel Lucent, Paris (FR)

( * ) Notice: Subject to any disclaimer, the term of this patent is extended or adjusted under 35 U.S.C. 154(b) by 0 days.

(21) Appl. No.: 12/459,243

(22) Filed: Jun. 29, 2009

(65) Prior Publication Data

US 2010/0329282 A1    Dec. 30, 2010

(51) Int. Cl.
*H04L 12/56*    (2006.01)

(52) U.S. Cl. ........................................................ 370/392

(58) Field of Classification Search .................. 370/392, 370/328, 349
See application file for complete search history.

(56) References Cited

U.S. PATENT DOCUMENTS

| | | | | |
|---|---|---|---|---|
| 7,224,673 B1 * | 5/2007 | Leung et al. | ................... | 370/328 |
| 2003/0028606 A1 * | 2/2003 | Koopmans et al. | ........... | 709/206 |
| 2003/0145064 A1 * | 7/2003 | Hsu et al. | ..................... | 709/219 |
| 2003/0227871 A1 * | 12/2003 | Hsu et al. | ..................... | 370/230 |
| 2004/0136476 A1 * | 7/2004 | Rosen et al. | ................... | 375/340 |
| 2006/0209789 A1 * | 9/2006 | Gupta et al. | ................... | 370/352 |
| 2007/0104118 A1 * | 5/2007 | Mega et al. | .................... | 370/254 |
| 2008/0089339 A1 * | 4/2008 | Tsirtsis et al. | ................ | 370/392 |

OTHER PUBLICATIONS

3GPP2 A.S0017-D, v1.0, *Interoperability Specification (IOS) for cdma2000 Access Network Interfaces—Part 7 (A10 and A11 Interfaces)*, Jun. 2007.

* cited by examiner

*Primary Examiner* — Albert T Chou
(74) *Attorney, Agent, or Firm* — D. M. La Bruno

(57) ABSTRACT

An exemplary apparatus includes a processor configured to compress an A11 message into a compressed message. The processor assigns a first value to a first portion of a first octet of the compressed message based on a message type field of the A11 message. The first portion may be three bits in length. The processor may also assign a second value to a second portion of the first octet of the compressed message based on a code field, a flags field and a status field of the A11 message. The second value may correspond to a set of values for the code, flags and status fields and may be five bits long. Third and fourth values are assigned to portions of a second octet of the compressed message based on an information element identifier and other field/s respectively of the A11 message so as to uniquely identify an information element.

20 Claims, 18 Drawing Sheets

| A11 INTERFACE MESSAGE NAME | A11 MESSAGE TYPE VALUE | FIRST 3 BITS OF FIRST OCTET OF THE COMPRESSED MESSAGE |
|---|---|---|
| A11-REGISTRATION-REQUEST | 01H | 000 |
| A11-REGISTRATION-REPLY | 03H | 001 |
| A11-REGISTRATION-UPDATE | 14H | 010 |
| A11-REGISTRATION-ACKNOWLEDGE | 15H | 011 |
| A11-SESSION-UPDATE | 16H | 100 |
| A11-SESSION-UPDATE-ACKNOWLEDGE | 17H | 101 |
| A11-CAPABILITIES-INFO | 18H | 110 |
| A11-CAPABILITIES-INFO-ACK | 19H | 111 |

R: ACCESS ROUTER

R: ACCESS ROUTER
COMP ELEMENT: INTER-OFFICE COMPRESSION NETWORK ELEMENT

——— COMPRESSED INTER-OFFICE TRAFFIC
- - - - UN-COMPRESSED INTER-OFFICE TRAFFIC
R: ACCESS ROUTER
COMP ELEMENT: INTER-OFFICE COMPRESSION NETWORK ELEMENT

FIG. 6

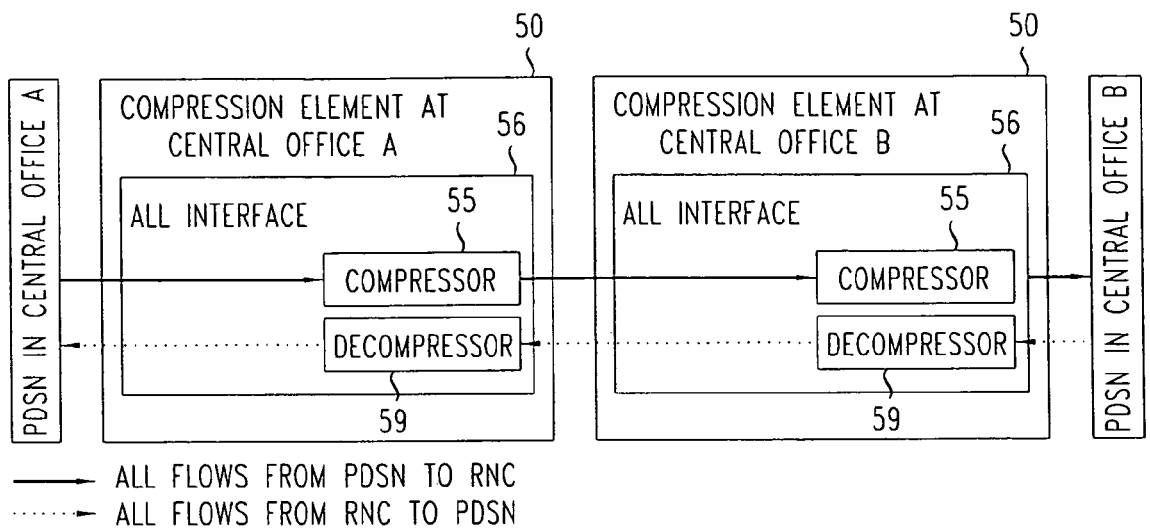

— ALL FLOWS FROM PDSN TO RNC
······ ALL FLOWS FROM RNC TO PDSN

FIG. 7

| ELEMENT NAME | IEI |
|---|---|
| MOBILE-HOME AUTHENTICATION EXTENSION | 20H |
| CRITICAL VENDOR/ORGANIZATION SPECIFIC EXTENSION | 26H |
| SESSION SPECIFIC EXTENSION | 27H |
| REGISTRATION UPDATE AUTHENTICATION EXTENSION | 28H |
| NORMAL VENDOR/ORGANIZATION SPECIFIC EXTENSION | 86H |

FIG. 8A

| A11 INTERFACE MESSAGE NAME | A11 MESSAGE TYPE VALUE | FIRST 3 BITS OF FIRST OCTET OF THE COMPRESSED MESSAGE |
|---|---|---|
| A11-REGISTRATION-REQUEST | 01H | 000 |
| A11-REGISTRATION-REPLY | 03H | 001 |
| A11-REGISTRATION-UPDATE | 14H | 010 |
| A11-REGISTRATION-ACKNOWLEDGE | 15H | 011 |
| A11-SESSION-UPDATE | 16H | 100 |
| A11-SESSION-UPDATE-ACKNOWLEDGE | 17H | 101 |
| A11-CAPABILITIES-INFO | 18H | 110 |
| A11-CAPABILITIES-INFO-ACK | 19H | 111 |

FIG. 8B

| A11 INTERFACE MESSAGE NAME | CODE | FLAGS | STATUS | LAST 5 BITS OF FIRST OCTET OF THE COMPRESSED MESSAGE |
|---|---|---|---|---|
| A11-REGISTRATION-REQUEST | | 0AH | | 11100 |
| | | 8AH | | 11101 |
| A11-REGISTRATION-REPLY | 00H | | | 00010 |
| | 80H | | | 00011 |
| | 81H | | | 00100 |
| | 82H | | | 00101 |
| | 83H | | | 00110 |
| | 85H | | | 00111 |
| | 86H | | | 01000 |
| | 88H | | | 01001 |
| | 89H | | | 01010 |
| | 8AH | | | 01011 |
| | 8DH | | | 01100 |
| A11-REGISTRATION-UPDATE | | | | |
| A11-REGISTRATION-ACKNOWLEDGE | | | 00H | 01101 |
| | | | 80H | 01110 |
| | | | 83H | 01111 |
| | | | 85H | 10000 |
| | | | 86H | 10001 |
| A11-SESSION-UPDATE | | | | |
| A11-SESSION-UPDATE-ACKNOWLEDGE | | | 00H | 10010 |
| | | | 80H | 10011 |
| | | | 83H | 10100 |
| | | | 85H | 10101 |
| | | | 86H | 10110 |
| | | | C9H | 10111 |
| A11-CAPABILITIES-INFO | | | | |
| A11-CAPABILITIES-INFO-ACK | | | | |

FIG. 8C

| A11 INTERFACE MESSAGE NAME | A11 MESSAGE TYPE VALUE | CODE | FLAGS | STATUS | FIRST 3 BITS OF FIRST OCTET OF THE COMPRESSED MESSAGE | LAST 5 BITS OF FIRST OCTET OF THE COMPRESSED MESSAGE | FIRST OCTET OF THE COMPRESSED MESSAGE (IN HEX) |
|---|---|---|---|---|---|---|---|
| A11-REGISTRATION-REQUEST | 01H | | 0AH | | 000 | 11100 | 1CH |
| | | | 8AH | | 000 | 11101 | 1DH |
| A11-REGISTRATION-REPLY | 03H | 00H | | | 001 | 00011 | 23H |
| | | 80H | | | 001 | 00100 | 24H |
| | | 81H | | | 001 | 00101 | 25H |
| | | 82H | | | 001 | 00110 | 26H |
| | | 83H | | | 001 | 00111 | 27H |
| | | 85H | | | 001 | 01000 | 28H |
| | | 86H | | | 001 | 01001 | 29H |
| | | 88H | | | 001 | 01010 | 2AH |
| | | 89H | | | 001 | 01011 | 2BH |
| | | 8AH | | | 001 | 01100 | 2CH |
| | | 8DH | | | 001 | 01101 | 2DH |
| A11-REGISTRATION-UPDATE | 14H | | | | 010 | 00000 | 40H |
| A11-REGISTRATION-ACKNOWLEDGE | 15H | | | 00H | 011 | 01110 | 6EH |
| | | | | 80H | 011 | 01111 | 6FH |
| | | | | 83H | 011 | 10000 | 70H |
| | | | | 85H | 011 | 10001 | 71H |
| | | | | 86H | 011 | 10010 | 72H |
| A11-SESSION-UPDATE | 16H | | | | 100 | 00000 | 80H |
| A11-SESSION-UPDATE-ACKNOWLEDGE | 17H | | | 00H | 101 | 10011 | B3H |
| | | | | 80H | 101 | 10100 | B4H |
| | | | | 83H | 101 | 10101 | B5H |
| | | | | 85H | 101 | 10110 | B6H |
| | | | | 86H | 101 | 10111 | B7H |
| | | | | C9H | 101 | 11000 | B8H |
| A11-CAPABILITIES-INFO | 18H | | | | 110 | 00000 | C0H |
| A11-CAPABILITIES-INFO-ACK | 19H | | | | 111 | 00000 | E0H |

FIG. 9A

| ELEMENT NAME | IEI | FIRST 3 BITS OF THE OCTET OF THE COMPRESSED INFORMATION ELEMENT |
|---|---|---|
| MOBILE-HOME AUTHENTICATION EXTENSION | 20H | 010 |
| CRITICAL VENDOR/ORGANIZATION SPECIFIC EXTENSION (CVSE) | 26H | 001 |
| SESSION SPECIFIC EXTENSION | 27H | 000 |
| REGISTRATION UPDATE AUTHENTICATION EXTENSION | 28H | 011 |
| NORMAL VENDOR/ORGANIZATION SPECIFIC EXTENSION (NVSE) | 86H | 100 |

FIG. 9B

| ELEMENT NAME | IEI | THE FIRST OCTET OF THE INFORMATION ELEMENT IN THE COMPRESSED MESSAGE | | |
|---|---|---|---|---|
| | | FIRST 3 BITS | LAST 5 BITS | VALUE (IN HEX) |
| MOBILE-HOME AUTHENTICATION EXTENSION | 20H | 010 | 00000 | 40H |

FIG. 9C

| ORIGINAL STRUCTURE (22 OCTETS) | COMPRESSED STRUCTURE (21 OCTETS) | OCTET |
|---|---|---|
| ALL ELEMENT IDENTIFIER (TYPE) = [20H] | TYPE = [40H] | 1 |
| LENGTH = [14H] | SPI (4 OCTETS, FROM 2 TO 5) | 2 |
| SPI (4 OCTETS, FROM 3 TO 6) | | 3 |
| | | 4 |
| | | 5 |
| | AUTHENTICATOR (16 OCTETS, FROM 6 TO 21) | 6 |
| AUTHENTICATOR (16 OCTETS, FROM 7 TO 22) | | 7 |
| | | ... |
| | LAST OCTET | 21 |
| LAST OCTET | | 22 |

*FIG. 10*A

| ELEMENT NAME | IEI | THE FIRST OCTET OF THE INFORMATION ELEMENT IN THE COMPRESSED MESSAGE | | |
|---|---|---|---|---|
| | | FIRST 3 BITS | LAST 5 BITS | VALUE (IN HEX) |
| REGISTRATION UPDATE AUTHENTICATION EXTENSION | 28H | 011 | 00000 | 60H |

*FIG. 10*B

| ORIGINAL STRUCTURE (22 OCTETS) | COMPRESSED STRUCTURE (21 OCTETS) | OCTET |
|---|---|---|
| ALL ELEMENT IDENTIFIER (TYPE) = [28H] | TYPE = [60H] | 1 |
| LENGTH = [14H] | SPI (4 OCTETS, FROM 2 TO 5) | 2 |
| SPI (4 OCTETS, FROM 3 TO 6) | | 3 |
| | | 4 |
| | | 5 |
| | AUTHENTICATOR (16 OCTETS, FROM 6 TO 21) | 6 |
| AUTHENTICATOR (16 OCTETS, FROM 7 TO 22) | | 7 |
| | | ... |
| | LAST OCTET | 21 |
| LAST OCTET | | 22 |

FIG. 11A

| ELEMENT NAME | SESSION ID VER | MSID TYPE | IEI | THE FIRST OCTET OF THE INFORMATION ELEMENT IN THE COMPRESSED MESSAGE | | | | |
|---|---|---|---|---|---|---|---|---|
| | | | | BIT 0-2 | BIT 3: SESSION ID VER | BIT 4: MSID TYPE | BIT 5-7 | VALUE (IN HEX) |
| SESSION SPECIFIC EXTENSION | 0 | 00 00H | 27H | 000 | 0 | 0 | 000 | 00H |
| | 0 | 00 06H | | | 0 | 1 | | 08H |
| | 1 | 00 00H | | | 1 | 0 | | 10H |
| | 1 | 00 06H | | | 1 | 1 | | 18H |

FIG. 11B

| ORIGINAL STRUCTURE | COMPRESSED STRUCTURE | OCTET |
|---|---|---|
| ALL ELEMENT IDENTIFIER (TYPE) = [27H] | ELEMENT-ID-SESSION-ID-MSID-TYPE = [00H, 08H, 10H, 18H] | 1 |
| LENGTH = Ks-2 | LENGTH = Ks-2-8 = Ks-10 | 2 |
| PROTOCOL-TYPE = [88 81H] (2 OCTETS, FROM 3 TO 4) | KEY (OCTETS, FROM 3 TO 6) | 3 |
| | | 4 |
| KEY (4 OCTETS, FROM 5 TO 8) | | 5 |
| | | 6 |
| | MS SESSION REFERENCE ID (1 OCTET) | 7 |
| | MSID DETAILS (VARIABLE NUMBER OF OCTETS, FROM 8 TO THE END, Ks-8) | 8 |
| RESERVED | | 9 |
| RESERVED + SESSION ID VER | | 10 |
| MS-SESSION-REFERENCE-ID (2 OCTETS, FROM 11 TO 12) | | 11 |
| | | 12 |
| MSID - TYPE (2 OCTETS, FROM 13 TO 14) | | 13 |
| | | 14 |
| MSID - LENGTH =Ks-15 | | 15 |
| MSID - DETAILS (VARIABLE NUMBER OF OCTETS, FROM 16 TO THE END, Ks) | | 16 |
| | | ... |
| | LAST OCTET | VARIABLE, Ks-8 |
| | | ... |
| LAST OCTET | | VARIABLE, Ks |

FIG. 12A

| ELEMENT NAME | APPLICATION TYPE | IEI | THE FIRST OCTET OF THE INFORMATION ELEMENT IN THE COMPRESSED MESSAGE | | | |
|---|---|---|---|---|---|---|
| | | | BIT 0-2 | BIT 3-4: APPLICATION TYPE | BIT 5-7 | VALUE (IN HEX) |
| CRITICAL VENDOR/ORGANIZATION SPECIFIC EXTENSION (CVSE) | 01H | 26H | 000 | 01 | 000 | 28H |
| | 02H | | | 10 | | 30H |
| | 03H | | | 11 | | 38H |

FIG. 12B

| ORIGINAL STRUCTURE | COMPRESSED STRUCTURE | OCTET |
|---|---|---|
| ALL ELEMENT IDENTIFIER (TYPE) = [26H] | ELEMENT-ID-APPLICATION-TYPE = [28H, 30H, 38H] | 1 |
| RESERVED = [00H] | LENGTH (2 OCTETS, FROM 2 TO 3) = $K_c$-7-NUMBER OF OCTETS SAVED FROM APPLICATION DATA FIELD | 2 |
| LENGTH (2 OCTETS, FROM 3 TO 4) = $K_c$ | | 3 |
| | APPLICATION-DATA | 4 |
| 3GPP2-VENDOR-ID = [00 00 15 9FH] (4 OCTETS, FROM 5 TO 8) | | 5 |
| | | 6 |
| | | 7 |
| | | 8 |
| APPLICATION-TYPE = [01H, 02H, 03H] | | 9 |
| APPLICATION-SUB-TYPE = [01H] | | 10 |
| APPLICATION-DATA | | 11 |
| | | ... |
| | LAST OCTET | VARIABLE, $K_c$-7-NUMBER OF OCTETS SAVED FROM APPLICATION DATA FIELD |
| | | ... |
| LAST OCTET | | VARIABLE, $K_c$ |

FIG. 12C

| ORIGINAL STRUCTURE | COMPRESSED STRUCTURE | OCTET |
|---|---|---|
| ALL ELEMENT IDENTIFIER (TYPE) = [26H] | ELEMENT-ID-APPLICATION-TYPE = [30H] | 1 |
| RESERVED = [00H] | | 2 |
| LENGTH = [00 06H] (2 OCTETS, FROM 3 TO 4) | | 3 |
| | | 4 |
| 3GPP2-VENDOR-ID = [00 00 15 9FH] (4 OCTETS, FROM 5 TO 8) | | 5 |
| | | 6 |
| | | 7 |
| | | 8 |
| APPLICATION-TYPE = [02H] | | 9 |
| APPLICATION-SUB-TYPE = [01H] | | 10 |

FIG. 12D

| ORIGINAL STRUCTURE | COMPRESSED STRUCTURE | OCTET |
|---|---|---|
| ALL ELEMENT IDENTIFIER (TYPE) = [26H] | ELEMENT-ID-APPLICATION-TYPE = [38H] | 1 |
| RESERVED = [00H] | | 2 |
| LENGTH = [00 06H] (2 OCTETS, FROM 3 TO 4) | | 3 |
| | | 4 |
| 3GPP2-VENDOR-ID = [00 00 15 9FH] (4 OCTETS, FROM 5 TO 8) | | 5 |
| | | 6 |
| | | 7 |
| | | 8 |
| APPLICATION-TYPE = [03H] | | 9 |
| APPLICATION-SUB-TYPE = [01H] | | 10 |

FIG. 13A

| TYPE | VENDOR-TYPE | THE FIRST OCTET OF ACCOUNTING PARAMETER WITHIN THE APPLICATION-DATA FIELD IN THE COMPRESSED MESSAGE (TYPE-VENDOR-TYPE FIELD) | | |
|---|---|---|---|---|
| | | BIT 0 | BIT 1-7: (VENDOR TYPE) | VALUE |
| 1AH | 9, 10, 11, 12, 13, 16,17, 18, 19, 20, 21, 32, 33, 39, 40, 41, 42, 45, 49, 50, 52, 83, 84, 85, 86, 87, 114 and 116 | 0 | SAME AS VENDOR-TYPE | SAME AS VENDOR-TYPE |
| 1FH | 9, 10, 11, 12, 13, 16, 17, 18, 19, 20, 21, 32, 33, 39, 40, 41, 42, 45, 49, 50, 52, 83, 84, 85, 86, 87, 114 and 116 | 1 | SAME AS VENDOR-TYPE | 128+X WHERE X IS THE VALUE OF VENDOR-TYPE |

FIG. 13B

| TYPE | VENDOR-TYPE | PARAMETER /VENDOR-VALUE | FORMAT | MAX SIZE IN ORIGINAL FORMAT (OCTET) | SIZE IN COMPRESSED FORMAT (OCTET) |
|---|---|---|---|---|---|
| 26 | 40 | AIRLINK-RECORD-TYPE | INTEGER | 4 | 1 |
| 26 | 11 | USER-ZONE | INTEGER | 4 | 1 |
| ... | ... | ... | ... | ... | ... |

FIG. 13C

| ORIGINAL STRUCTURE | COMPRESSED STRUCTURE | OCTET |
|---|---|---|
| TYPE = [1AH, 1FH] | TYPE-VENDOR-TYPE | 1 |
| LENGTH = Kc | LENGTH = Kc-6-P | 2 |
| 3GPP2-VENDOR-ID = [00 00 15 9FH] (4 OCTETS, FROM 3 TO 6) | VENDOR VALUE (VARIABLE SIZE) FLAGS | 3 |
| | | 4 |
| | | 5 |
| | | 6 |
| VENDOR-TYPE | | 7 |
| VENDOR-LENGTH | | 8 |
| VENDOR-VALUE (VARIABLE SIZE) | | 9 |
| | | 10 |
| | | ... |
| | LAST OCTET | VARIABLE, Kc-6-P |
| | | ... |
| LAST OCTET | | VARIABLE, Kc |

FIG. 14A

| ELEMENT NAME | IEI | APPLICATION TYPE | APPLICATION SUB TYPE | THE FIRST OCTET OF THE COMPRESSED INFORMATION ELEMENT | | | |
|---|---|---|---|---|---|---|---|
| | | | | BIT 0-2 | BIT 3: APPLICATION SUB TYPE | BIT 4-7: APPLICATION TYPE (IN HEX) | VALUE (IN HEX) |
| NORMAL VENDOR/ ORGANI- ZATION SPECIFIC EXTENSION (NVSE) | 86H | 04H | 01H | 100 | 0 | 4H | 84H |
| | | 05H | 01H | | 0 | 5H | 85H |
| | | 06H | 01H | | 0 | 6H | 86H |
| | | 07H | 01H | | 0 | 7H | 87H |
| | | 08H | 01H | | 0 | 8H | 88H |
| | | | 02H | | 1 | | 98H |
| | | 09H | 01H | | 0 | 9H | 89H |
| | | 0AH | 01H | | 0 | AH | 8AH |
| | | | 02H | | 1 | | 9AH |
| | | 0BH | 01H | | 0 | BH | 8BH |
| | | | 02H | | 1 | | 9BH |

FIG. 14B

| ORIGINAL STRUCTURE | COMPRESSED STRUCTURE | OCTET |
|---|---|---|
| ALL-ELEMENT-IDENTIFIER (TYPE)=[86H] | ELEMENT-ID-APPLICATION-TYPE-SUB-TYPE = [84H 85H, 86H, 87H, 88H, 98H, 89H, 8AH, 9AH, 8BH, 9BH] | 1 |
| LENGTH = K | LENGTH = Kn-8-P | 2 |
| RESERVED = [00 00H] (2 OCTETS, FROM 3 TO 4) | APPLICATION DATA | 3 |
| | | 4 |
| 3GPP2-VENDOR-ID = [00 00 15 9FH] (4 OCTETS, FROM 5 TO 8) | | 5 |
| | | 6 |
| | | 7 |
| | | 8 |
| APPLICATION-TYPE | | 9 |
| APPLICATION-SUB-TYPE | | 10 |
| APPLICATION DATA | | 11 |
| | | ... |
| | LAST OCTET | VARIABLE, Kn-8-P |
| | | ... |
| LAST OCTET | | VARIABLE, Kn |

FIG. 15

| COMPRESSED STRUCTURE (1 OCTET) | ORIGINAL STRUCTURE (2 OCTETS) |
|---|---|
| 00 21H | 21H |
| 00 3CH | 3CH |
| 00 3DH | 3DH |

FIG. 16

| FIG. 16a |
|---|
| FIG. 16b |
| FIG. 16c |

FIG. 16A

| ORIGINAL MESSAGE | OCTET | COMPRESSED MESSAGE | OCTET |
|---|---|---|---|
| ALL-MESSAGE-TYPE = [01H] | 1 | ALL-MESSAGE-TYPE-CODE-FLAGS-STATUS = [1CH, 1DH] | 1 |
| FLAGS = [0AH, 8AH] | 1 | LIFETIME = [00 00H TO FF FEH] | 1 |
| LIFETIME = [00 00H TO FF FEH] | 1 | | 2 |
| | 2 | HOME AGENT = <ANY VALUE> | 1 |
| HOME ADDRESS = [00 00 00 00H] | 1 | | 2 |
| | 2 | | 3 |
| | 3 | | 4 |
| | 4 | CARE-OF-ADDRESS = <ANY VALUE> | 1 |
| HOME AGENT = <ANY VALUE> | 1 | | 2 |
| | 2 | | 3 |
| | 3 | | 4 |
| | 4 | IDENTIFICATION = <ANY VALUE> | 1 |
| CARE-OF-ADDRESS = <ANY VALUE> | 1 | | 2 |
| | 2 | | 3 |
| | 3 | | 4 |
| | 4 | | 5 |
| IDENTIFICATION = <ANY VALUE> | 1 | | 6 |
| | 2 | | 7 |
| | 3 | | 8 |
| | 4 | | |
| | 5 | | |
| | 6 | | |
| | 7 | | |
| | 8 | | |
| SESSION SPECIFIC EXTENSION = [27H] | 1 | ELEMENT-ID-SESSION-ID-MSID-TYPE = [08H, 18H] | 1 |
| LENGTH = [13H-15H] | 2 | LENGTH = [13H-15H] | 2 |
| PROTOCOL-TYPE = [88 81H] | 3 | KEY = <ANY VALUE> | 3 |
| | 4 | | 4 |
| KEY = <ANY VALUE> | 5 | | 5 |
| | 6 | | 6 |
| | 7 | MS-SESSION-REFERENCE ID = [01H - 06H] | 7 |
| | 8 | MSID-DETAILS (CARIABLE NUMBER OF OCTETS, FROM 8 TO Ks-8) | 8 |
| RESERVED = [00H] | 9 | | |
| RESERVED = [0000 00], SESSION-ID-VER = [00, 01] | 10 | | |
| MS-SESSION-REFERENCE ID = [00 01H - 00 06H] | 11 | | |

*FIG. 16B*

| | | | |
|---|---|---|---|
| | 12 | | |
| MSID-TYPE = [00 06H] | 13 | | |
| | 14 | | |
| MSID-LENGTH = [06-08H] LENGTH - 13 | 15 | | |
| MSID-DETAILS (VARIABLE NUMBER OF OCTETS, FROM 16 TO Ks) | 16 | | |
| | . . | | . . . |
| | . . . | LAST OCTET FOR SESSION SPECIFIC INFORMATION | Ks-8 |
| | . . . | | . . . |
| LAST OCTET FOR SESSION SPECIFIC INFORMATION IE | Ks | | |
| CRITICAL VENDOR/ORGANIZATION SPECIFIC EXTENSION = [26H] | 1 | ELEMENT-ID-APPLICATION-TYPE = [28H, 30H] | 1 |
| RESERVED = [00H] | 2 | LENGTH = <VARIABLE> (NOTE WHEN APPLICATION-TYPE = [02H], ELEMENT-ID-APPLICATION-TYPE = [30H], LENGTH FIELD DOES NOT EXIST | 2 |
| LENGTH = <VARIABLE> | 3 | | 3 |
| | 4 | APPLICATION-DATA = <VARIABLE OCTETS, FROM 4 TO Kc-7> (NOTE WHEN APPLICATION-TYPE = [20H], ELEMENT-ID-APPLICATION-TYPE = [30H], APPLICATION-DATA FIELD DOES NOT EXIST | 4 |
| 3GPPS2-VENDOR-ID = [00 00 15 9FH] | 5 | | |
| | 6 | | |
| | 7 | | |
| | 8 | | |
| APPLICATION-TYPE = [01H, 02H] | 9 | | |
| IF (APPLICATION-TYPE = 0H) { | | | |
| APPLICATION-SUB-TYPE = [01H] | 10 | | |
| APPLICATION-DATA = <VARIABLE OCTETS, FROM 11 TO Kc> | 11 | | |
| | . . . | | . . . |
| | | LAST OCTET FOR CRITICAL VENDOR/ORGANIZATION SPECIFIC EXTENSION | Kc-7 |
| | | | |
| } | Kc | | |
| ELSE IF (APPLICATION-TYPE = 02H){ | | | |

FIG. 16C

| | | | |
|---|---|---|---|
| APPLICATION-SUB-TYPE = [01H]} | M | | |
| NORMAL VENDOR/ORGANIZATION SPECIFIC EXTENSION = [86H] | 1 | ELEMENT-ID-APPLICATION-TYPE-SUB-TYPE = [84H,85H, 86H, 89H, 8BH, 9BH] | 1 |
| LENGTH = <VARIABLE> | 2 | LENGTH = <VARIABLE> | 2 |
| RESERVED = [00 00H] | 3 | APPLICATION-DATA = <VARIABLE OCTETS, FROM 3 TO Kn-8> | 3 |
| | 4 | | |
| 3GPPS-VENDOR-ID = [00 00 15 9FH] | 5 | | ... |
| | 6 | | |
| | 7 | | |
| | 8 | | |
| APPLICATION-TYPE = [04, 05H, 06H, 09H, 0BH] | 9 | | |
| APPLICATION-SUB-TYPE = [01H, 02H] | 10 | | |
| APPLICATION-DATA = <VARIABLE OCTETS, FROM 11 TO Kn> | 11 | | |
| | ... | | ... |
| | ... | LAST OCTET FOR NORMAL VENDOR/ORGANIZATION SPECIFIC EXTENSION | Kn-8 |
| | ... | | |
| LAST OCTET FOR NORMAL VENDOR/ORGANIZATION SPECIFIC EXTENSION | Kn | | |
| MOBILE-HOME AUTHENTICATION EXTENSION = [20H] | 1 | TYPE = [40H] | 1 |
| LENGTH = [14H] | 2 | SPI = [00 00 01 00H TO FF FF FF FFH] | 2 |
| SPI = [00 00 01 00H TO FF FF FF FFH] | 3 | | 3 |
| | 4 | | 4 |
| | 5 | | 5 |
| | 6 | AUTHENTICATOR = <ANY VALUE, 16 OCTETS> | 6 |
| AUTHENTICATOR = <ANY VALUE, 16 OCTETS> | 7 | | 7 |
| | ... | | ... |
| | ... | LAST OCTET FOR MOBILE-HOME AUTHENTICATION EXTENSION | 21 |
| LAST OCTET FOR MOBILE-HOME AUTHENTICATION EXTENSION | 22 | | |

*FIG. 17*

| INFORMATION ELEMENT | REDUCTION IN SIZE (OCTET) | ORIGINAL SIZE (OCTET) |
|---|---|---|
| A11 MESSAGE TYPE | 0 | 1 |
| FLAGS | 1 | 1 |
| LIFETIME | 0 | 2 |
| HOME ADDRESS | 4 | 4 |
| HOME AGENT | 0 | 4 |
| CARE-OF-ADDRESS | 0 | 4 |
| IDENTIFICATION | 0 | 8 |
| SESSION SPECIFIC EXTENSIONS | 8 | Ks (Ks = 23 IN PRACTICE) |
| CVSE (MOBILITY EVENT INDICATOR OR DATA AVAILABILITY INDICATOR) | 9 | 10 |
| NVSE | 8+P | Kn |
| MOBILE-HOME AUTHENTICATION EXTENSION | 1 | 22 |
| TOTAL FOR THE MESSAGE | 31+P | 56+Ks+Kn |

*FIG. 18*

| INFORMATION ELEMENT | REDUCTION IN SIZE (OCTET) | ORIGINAL SIZE (OCTET) |
|---|---|---|
| A11 MESSAGE TYPE | 0 | 1 |
| FLAGS | 1 | 1 |
| LIFETIME | 0 | 2 |
| HOME ADDRESS | 4 | 4 |
| HOME AGENT | 0 | 4 |
| CARE-OF-ADDRESS | 0 | 4 |
| IDENTIFICATION | 0 | 8 |
| SESSION SPECIFIC EXTENSIONS | 8 | Ks (Ks = 23 IN PRACTICE) |
| CVSE (ACCOUNTING) | (7+SUM$_i$(Qi)) | Kc |
| NVSE | 8+P | Kn |
|  |  |  |
| MOBILE-HOME AUTHENTICATION EXTENSION | 1 | 22 |
| TOTAL FOR THE MESSAGE | 29+SUM$_i$(Qi) | 46+Ks+Kc+Kn |

APPARATUS AND METHOD FOR INTER-OFFICE COMPRESSION

FIELD OF THE INVENTION

The invention relates to communication systems, and, in particular, to systems, apparatuses and methods for compression of communications between network elements in a communication system.

BACKGROUND

Cellular networks such as Code Division Multiple Access (CDMA), Universal Mobile Telecommunications System (UMTS) and Long Term Evolution (LTE) use the hierarchical structure. For example, in the CDMA2000 Radio Access Network (RAN), multiple Mobile Stations (MSs) connect to a Base Station (BTS); multiple BTSs connect to a Base Station Controller (BSC) and Packet Control Function (PCF) which typically are collocated at Radio Network Controller (RNC); multiple RNCs connect to a Packet Data Serving Node (PDSN). The PDSN serves as the gateway from the RAN to the rest of the packet network. When Mobile IP (MIP) is used, the MIP Foreign Agent (FA) is located on the PDSN and all traffic associated with a MS will be tunneled between the FA and the MIP Home Agent (HA). For authentication, authorization and accounting (AAA) purposes, the RNC connects to the AAA server for the access network, which is called an Access Network-AAA (AN-AAA), and the HA connects to the AAA server for the entire network. FIG. 1 graphically illustrates the hierarchy of network elements in an exemplary CDMA2000 RAN, as discussed above.

In deployed (i.e., real life) cellular networks, typically not all network elements are located in the same central office (CO). In fact, because of geographic considerations and the need to provide load balancing and fault tolerance between elements in the hierarchically designed network, RNCs are typically connected to PDSNs located in different central offices across wide area networks (WAN). Similarly, PDSNs are typically connected to Home Agents located in different central offices across WAN. It is also possible for AN-AAAs and RNCs to be residing in different offices and for AAAs and Home Agents to be located in different offices.

FIG. 2 depicts an illustrative portions of a network in which CDMA2000 network elements are distributed across two central offices A and B. Any connection between network elements beyond an RNC needs to cross the WAN between the central offices. Given the configuration of FIG. 2, all of the interface traffic must pass through access routers (R) connecting the central offices. As a result, the following interfaces between network elements all contribute to inter-office WAN traffic:

A10 interface for data and A11 interface for signaling between RNC and PDSN,
A12 interface between RCN and AN-AAA,
A13 interface between Home Agent and AAA, and
IP-in-IP tunneling traffic for Mobile IP between PDSN and Home Agent.

As 3G data service becomes increasingly popular, wireless service providers (WSPs) experience increased inter-office traffic load and the consequent bandwidth requirements for inter-office traffic increase.

SUMMARY

Provided are novel architectures for WSP inter-office traffic reduction using compression. Inter-office compression network elements that connected to access routers of WSP central offices, process all flows and apply appropriate compression and decompression based on standards defined interfaces between cellular network elements. The architecture and the design of the compression element are generic and applicable to various cellular networks such as CDMA2000, UMTS, LTE etc.

Compression and corresponding decompression methodologies are provided for the A11 signaling interface between PDSNs and RNCs in the CDMA2000 network. Apparatuses and methods for compressing an A11 message into a compressed message and decompressing a compressed message into a A11 message are provided. Stateless and lossless compression techniques are utilized to reformat standards defined A11 message structures to save on bandwidth usage between PDSNs and RNCs.

Compression of A11 messages serves to reduce the bandwidth requirements experienced by WSPs in their inter-office traffic load as a result of the increasing popularity of, for example, 3G data service. Compression offers tradeoff between processing time and bandwidth usage. However, as processors are rapidly becoming more powerful, and bandwidth cost (in terms of service cost and equipment cost) is not decreasing as quickly, data compression as offered herein becomes increasingly important for bandwidth reduction.

An exemplary apparatus according to the invention includes a processor configured to compress an A11 message into a compressed message. The processor is configured to assign a first value to a first portion of a first octet of the compressed message based on a message type field of the A11 message. The first value corresponds to a value of the message type field. The first portion may be three bits in length.

The processor may also be configured to assign a second value to a second portion of the first octet of the compressed message based on a code field, a flags field and a status field of the A11 message. For example, the second value may correspond to a set of values for the code field, the flags field and the status field. The second portion may be five bits in length.

In another embodiment, the processor is also configured to assign a third value to a third portion of a second octet of the compressed message based on an information element identifier of the A11 message. For example, the third value of the third portion of the second octet corresponds to a value of the information element identifier. The processor may also be configured to assign a fourth value to a fourth portion of the second octet of the compressed message based on one of (i) a session identification version field and a Mobile Station ID (MSID) type field, (ii) an application type field, or (iii) an application type field and an application sub-type field of the A11 message.

In one embodiment, the processor refrains from specifying in the compressed message additional data that corresponds to another field of the A11 message when the another field has a fixed value for A11 messages of a first message type. In a further embodiment, the processor specifies in the compressed message data that corresponds to another field of the A11 message when the another field has a variable value for A11 messages of a first message type. The processor may set a value of a length field in the compressed message so as to reflect adjustment in length of an information element of the compressed message from that of a corresponding information element of the A11 message.

In another, embodiment, the processor compresses the A11 message depending on whether the A11 message is directed to a network element capable of decompressing a compressed message. For example, the processor may interact with a memory indicating a plurality of network elements capable of decompressing a compressed message.

An exemplary method according to the invention includes compressing at a first network element an A11 message destined for a second network element into a compressed message, the compressing assigning a first portion of a first octet of the compressed message a first value based on a message type field of the A11 message. The first value of the first portion of the first octet may correspond to a value of the message type field. The first portion may be three bits in length.

In one embodiment, the compressing further includes assigning a second portion of the first octet of the compressed message a second value based on a code field, a flags field and a status field of the A11 message. The second value corresponds to a set of values for the code field, the flags field and the status field. The second portion may be five bits in length.

In another embodiment, the compressing further includes assigning a third portion of a second octet of the compressed message a third value based on an information element identifier of the A11 message. For example, the third value of the third portion of the second octet may correspond to a value of the information element identifier. In a further embodiment, the compressing also includes assigning a fourth portion of the second octet of the compressed message a fourth value based on one of (i) a session identification version field and a Mobile Station ID (MSID) type field, (ii) an application type field, or (iii) an application type field and an application sub-type field of the A11 message.

In one embodiment, compressing further includes refraining from specifying additional data that corresponds to another field of the A11 message into the compressed message when the another field has a fixed value for A11 messages of a first message type. In another embodiment, compressing further includes specifying in the compressed message data that corresponds to another field of the A11 message when the another field has a variable value for A11 messages of a first message type. Specifying may include setting a value of a length field in the compressed message so as to reflect adjustment in length of an information element of the compressed message from that of a corresponding information element of the A11 message.

In one embodiment, the compressing is based on an indication of whether the second network element is capable of decompressing a compressed A11 message. The method may include determining the indication of whether the second network element is capable of decompressing a compressed A11 message.

Embodiments of the invention include processors configured decompress a compressed message and methods for decompressing a message into an A11 message. In one exemplary embodiment, the method includes decompressing at a first network element a message into an A11 message, with the decompressing assigning a value to a message type field of the A11 message based on first portion of a first octet of the message. The value of the message type field corresponds to a first value of the first portion of the first octet. The first portion may be three bits in length.

In one embodiment, the decompressing further assigns a set of values to a code field, a flags field and status field of the A11 message based on a second portion of the first octet of the message. The set of values for the code field, the flags field and the status field may correspond to a second value of the second portion of the first octet, which is five bits in length in a further embodiment.

In an embodiment, the method may also include determining an indication of whether the message was received from a network element is capable of compressing A11 messages. In another, the decompressing may be based on an indication of whether the message was received from a network element capable of compressing A11 messages. The compression and decompression functionality provided can be used as building blocks to derive bandwidth savings for the A11 interface as part of an inter-office traffic reduction solution.

Reference herein to "one embodiment", "another embodiment", "an exemplary embodiment" and "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. Although various embodiments which incorporate the teachings of the present invention have been shown and described in detail herein, those skilled in the art can readily devise many other varied embodiments that still incorporate these teachings.

BRIEF DESCRIPTION OF THE DRAWINGS

Example embodiments will become more fully understood from the detailed description given herein below and the accompanying drawings, wherein like elements are represented by like reference numerals or character references, which are given by way of illustration only and thus are not limiting of the present invention.

FIG. 6 depicts an illustrative system with Inter-Office Compression Network Elements for compression of traffic between PSDN and RNC of central offices A and B.

FIG. 7 lists A11 message Information Element Identifiers by name sorted by value.

FIG. 8a lists A11 interface message names sorted by A11 message type values of the first octet in each uncompressed A11 message, followed by the values of the first three bits of the first octet in each compressed message.

FIG. 8b lists the values of Code, Flags and Status fields for different A11 message types followed by the value of the last five bits of the first octet in the compressed A11 message.

FIG. 8c lists the different values of the first octet in the compressed message representing A11-Message-Type, Code, Flags and Status fields of the uncompressed message.

FIG. 9a lists the mapping of Information Element Identifier to the first three bits of the first octet for an information element in a compressed message.

FIG. 9b shows the first octet of Mobile-Home Authentication Extension information element in its compressed form.

FIG. 9c shows the specification of the original and compressed structure of the Mobile-Home Extension information element.

FIG. 10a shows the first octet of the Registration Update Authentication Extension information element in its compressed form.

FIG. 10b shows the specification of the original and compressed structure of the Registration Update Authentication Extension information element.

FIG. 11a shows the first octet of the Session Specific Extension information element in its compressed form.

FIG. 11b shows the specification of the original and compressed structure of the Session Specific Extension information element.

FIG. 12a shows the first octet of the Critical Vendor/Organization Specific Extension (CSVE) information element in its compressed form.

FIG. 12b shows the specification of the original and compressed top level structure of the CSVE information element.

FIG. 12c shows the specification of the original and compressed top level structure of the CSVE with Application Type Mobility Event Indicator.

FIG. 12d shows the specification of the original and compressed top level structure of the CSVE with Application Type Data Availability Indicator.

FIG. 13a lists the structure for the first octet of the Accounting Parameter within the Application-Data field of a CVSE Information Element.

FIG. 13b lists a few Vendor-Values with their original and compressed lengths.

FIG. 13c specifies the original and compressed structure for the Accounting Parameter within the Application-Data field of the CVSE information element, assuming the Vendor-Value field can be compressed by P octets.

FIG. 14a lists the structure for the first octet of the Normal Vendor/Organization Specific Extension (NVSE) information element in its compressed form.

FIG. 14b specifies the original and compressed structure for NVSE assuming P octets can be saved from the Application-Data Field in the compressed structure.

FIG. 15 lists the Original and Compressed Structure for Service-Option Value in Application-Data field of a NVSE information Element.

FIG. 16, which comprises FIGS. 16a, 16b, and 16c compares the original and compressed A11-Registration-Request message format based on the original message format specified by the A11 message standards.

FIG. 17 specifies bandwidth savings for an A11-Registration-Request Message where the CVSE is for Mobility Event Indicator or Data Availability Indicator and the A11 message is compressed according to one embodiment of the invention.

FIG. 18 specifies bandwidth savings for A11-Registration-Request Message where the CVSE is for Accounting and the A11 message is compressed according to one embodiment of the invention.

DETAILED DESCRIPTION

Various example embodiments will now be described more fully with reference to the accompanying figures, it being noted that specific structural and functional details disclosed herein are merely representative for purposes of describing example embodiments. Example embodiments may be embodied in many alternate forms and should not be construed as limited to only the embodiments set forth herein.

It will be understood that, although the terms first, second, etc. may be used herein to describe various elements, items, values and location, depending on context of the description, these terms should not be limited since such terms are only used to distinguish, for example, one element from another. For instance, a first element could be termed a second element, and, similarly, a second element could be termed a first element, without departing from the scope of example embodiments. As used herein, the term "and" is used in both the conjunctive and disjunctive sense and includes any and all combinations of one or more of the associated listed items. The singular forms "a", "an" and "the" are intended to include the plural forms as well, unless the context clearly indicates otherwise. It will be further understood that the terms "comprises", "comprising,", "includes" and "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted. For example, two figures shown in succession may in fact be executed substantially concurrently or may sometimes be executed in the reverse order, depending upon the functionality/acts involved.

Figure 1:
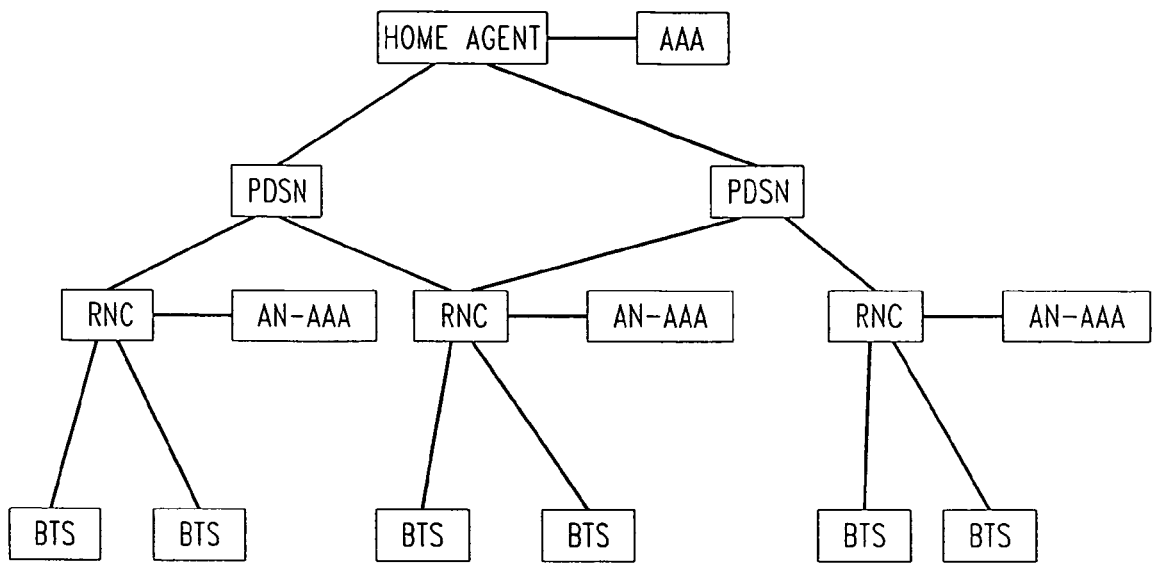
FIG. 1 is an exemplary illustration of the hierarchy of network elements in a CDMA2000 RAN.
Figure 2:
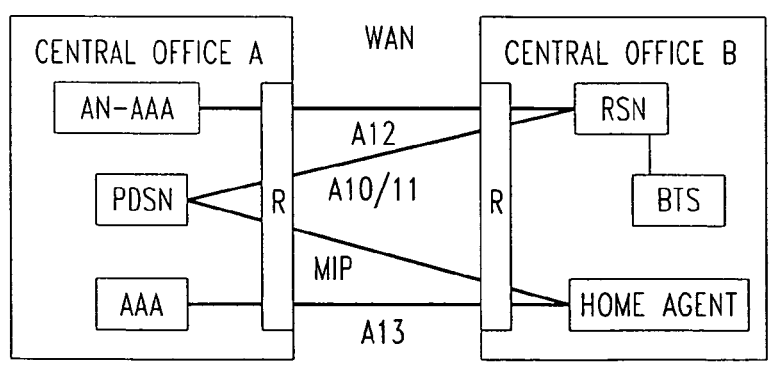
FIG. 2 depicts an illustrative portion of a network in which CDMA2000 network elements are distributed across two central offices A and B.
Figure 3:
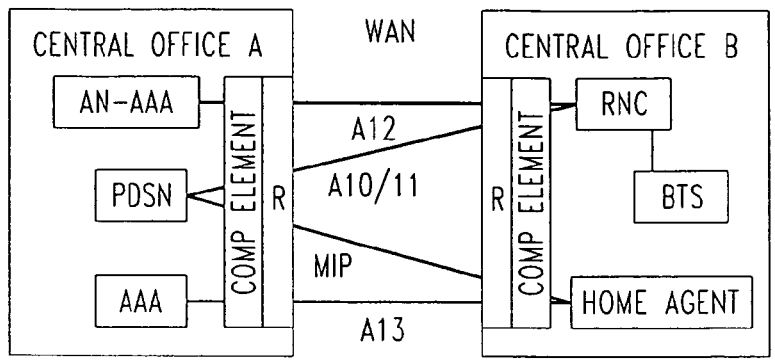
FIG. 3 shows an exemplary embodiment of compression elements in an exemplary pair of CDMA2000 network central offices.

FIG. 3 shows an exemplary embodiment of compression elements in an exemplary pair of CDMA2000 network central offices. As previously noted, inter-office traffic load may be reduced through the compression of inter-office traffic. A novel architecture for such a purpose is provided in which Inter-Office Compression Network Elements, compression elements (Comp Element) for short, are connected to the access routers (R) of WSP central offices. These compression elements are deployed in pairs between a pair of central offices to offer traffic compression and decompression over all possible interfaces across central offices. Other network elements are as previously described.

Figure 4:
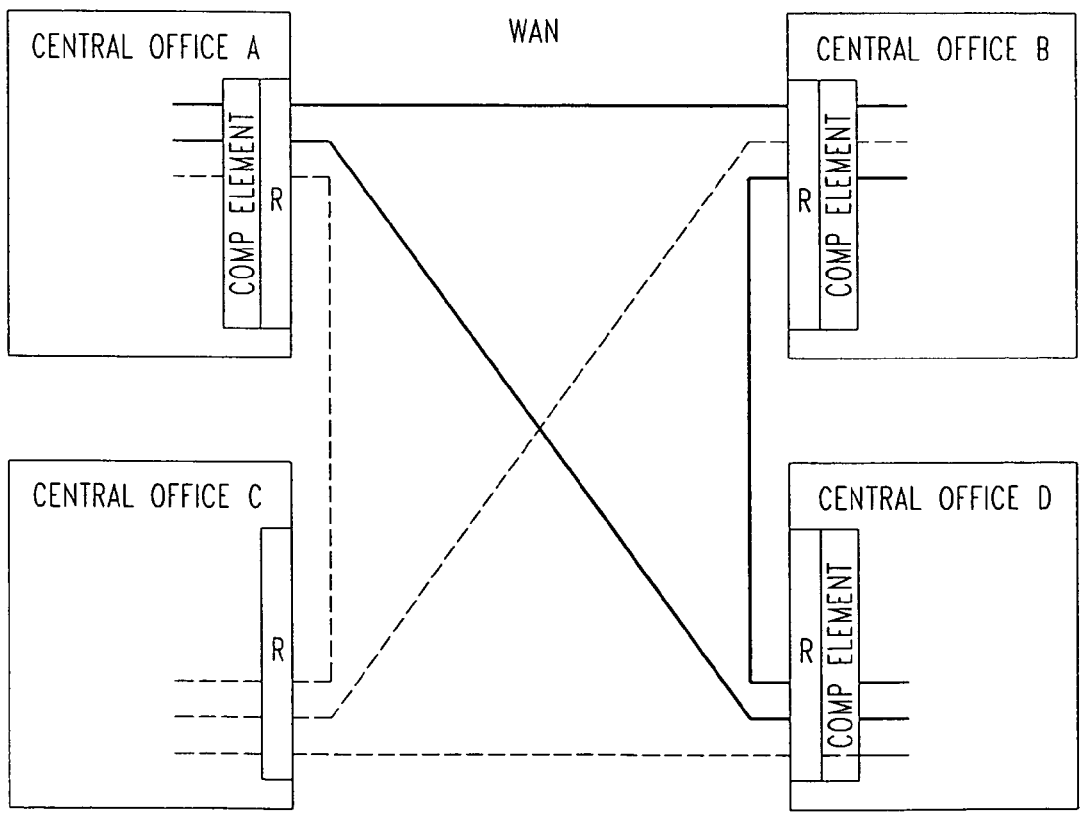
FIG. 4 depicts an exemplary system in which Inter-Office Compression Network Elements are located in multiple Central Offices to offer traffic compression over interfaces between pairs of Central Offices.

FIG. 4 depicts an exemplary system in which Inter-Office Compression Network Elements are located in multiple COs to offer traffic compression over interfaces between pairs of COs. To permit incremental deployment, the compression elements are designed to be deployed to a pair of central offices at a time. At each compression element, compression is only applied to inter-office traffic destined to a central office equipped with the corresponding compression element. In FIG. 4, four central offices are illustrated in the exemplary cellular network, where compression elements have been deployed at central offices A, B and D, but not C. Because compression elements work in pairs, compression is applied to traffic between A and B, between A and D, and between B and D (compressed traffic represented by the solid line of FIG. 4). However, no compression is applied to traffic between A and C, between B and C, and between C and D (uncompressed traffic represented by the dotted line of FIG. 4).

The inter-office compression network element for a central office is connected to the access router and processes all traffic to and from the access router. In one embodiment, the compression element for central office resides next to the access router and processes all traffic to and from the access router. Alternatively, the compression element may be incorporated into the router For each interface between cellular network elements located across WAN in different central offices, the compression element contains a pair of compressor and decompressor for the interface. The compressor element is designed with incremental deployment. Accordingly, the compressor element is bypassed for traffic to and from central offices that are not equipped with a compression element, and the compressor element is bypassed for traffic to and from interfaces that are not equipped with a pair of compressor and decompressor.

In one embodiment, each compression element maintains or has access to "Compressed IP List" which contains the IP addresses of the network elements located in other central offices that are equipped with compression elements. For each IP address in the Compressed IP List, each compression element may also maintain or have access to a "Compressed Interface List" which contains the list of interfaces (e.g., A10 interface, A11 interface, etc.) that are compressed for the incoming and outgoing traffic.

From the high level, the compression element needs to compress certain flows leaving the central office and decompress compressed flows arriving at the central office. The compression element also must let flows that do not have a corresponding decompressor at the other (i.e., destination) central office pass through without modification. When the Compressed IP List, Compressed Interface List for each IP are maintained correctly at compression elements installed at central offices, all compression elements within the network will function properly, meaning that when a flow is sent to a decompressor module, the flow is a compressed flow.

Figure 5:
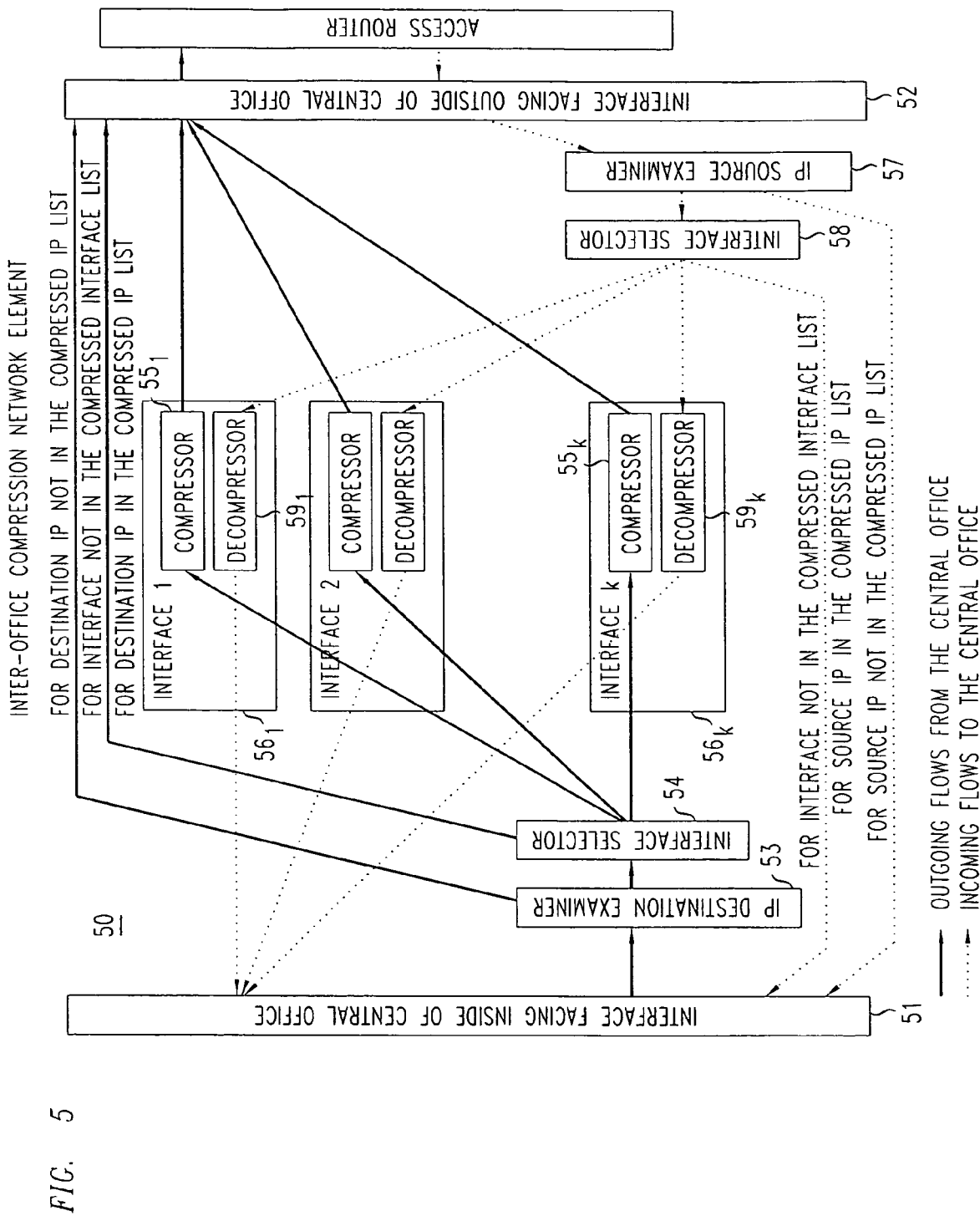
FIG. 5 depicts an exemplary Inter-Office Compression Network Element.

FIG. 5 depicts an exemplary Inter-Office Compression Network Element. As shown, the compression element 50 is equipped with two network interfaces: one facing inside of the central office 51, the other facing outside of the central office 52. A11 traffic coming in from the interface facing inside of the central office will pass through an "IP Destination Examiner" module 53. If the destination IP address of a flow is not in the Compressed IP list, then the flow is sent directly to the interface facing outside of the central office bypassing all the compressors. If the destination IP address of a flow is in the Compressed IP list, then the flow passes an "Interface Selector" module 54. If the flow does not belong to any interface listed in the Compressed Interface List for the flow's destination IP address, then the flow is sent directly to the interface facing outside of the central office bypassing all the compressors. Otherwise, the flow is compressable, and so passes through the compressor module $55_{1-K}$ of that interface $56_{1-K}$ (e.g., A10 interface, A11 interface, etc.) before arriving at the interface facing outside of the central office. A11 traffic arriving at this interface 52 will be sent to the access router to leave the central office.

Similarly, all traffic coming in from the access router through the interface facing outside of the central office will pass through an "IP Source Examiner" module 57. If the source IP address of a flow is not in the Compressed IP list, then the flow is sent directly to the interface facing inside of the central office bypassing all the decompressors. If the source IP address of a flow is in the Compressed IP list, then the flow must pass the "Interface Selector" module 58. If the flow does not belong to any interface listed in the Compressed Interface List for the flow's source IP address, then the flow is sent directly to the interface facing inside of the central office bypassing all the decompressors. Otherwise, the flow is compressed and passes through the decompressor module $59_{1-K}$ of that interface $56_{1-K}$ (e.g., A10 interface, A11 interface, etc.) before arriving at the interface 51 facing inside of the central office. Traffic arriving at this interface 51 will be sent to different network elements inside this central office.

FIG. 6 depicts an illustrative system with Inter-Office Compression Network Elements for compression of traffic between PSDN and RNC of central offices A and B. In CDMA2000 networks, PSDNs and RNCs are located in central offices in WSP networks. Due to geographic considerations and the need to provide load balancing and fault tolerance between elements in the hierarchically designed RAN, RNCs are typically connected to PDSNs located in different central offices across WAN. As a result, traffic between PDSNs and RNCs contribution significantly to WSP inter-office traffic load. Only a single compression element for the A11 interface is shown in FIG. 6 for ease of understanding.

Network performance can be improved by reducing inter-office traffic through compression of signaling interfaces in RAN that contribute to inter-office traffic load. In the CDMA2000 RAN, the signaling interface between one or more PDSNs and one or more PCFs or RNCs is defined by the 3GPP2 standard as the A11 interface. Because the A11 interface is an interface over wired networks, its definition is not as compact as possible.

A suite of stateless compression methods for A11 messages is provided. The methods are stateless and lossless. Stateless in this context means that each A11 message can be compressed and decompressed independently, and no state information for each A11 message exchange is stored at either end of the A11 interface (PDSN or PCF) in order to compress and decompress future A11 exchanges. Lossless in this context means that when one end of the A11 interface sends a compressed A11 message, and the other end of the interface receives the compressed message and decompress it, the original uncompressed A11 message is recovered and no information is lost. Each endpoint of the A11 interface would require a compressor to compress outgoing A11 messages and a decompressor to decompress incoming A11 messages in the compressed form. To illustrate the deployment scenarios for the A11 interface compressor and decompressor modules between a PDSN-RNC pair, we assume the PDSN is located in Central Office A, and the RNC is located in Central Office B.

As shown in FIG. 6, the compression element 50 for each central office contains a compressor 55 and decompressor 59 for A11 interface 56. The compressor module in one compression element directly interfaces with the decompressor module in the other compression element. For clarity, the IP Destination Examiner, the IP Source Examiner and the Interface Selector in the compression elements are omitted from the figure. All A11 messages received by either the PDSN or the RNC must pass by the decompressor, and any original uncompressed A11 message will be ignored by the decompressor. This functionality offers a safety feature in case the originator of the A11 message accidentally bypass its compressor, such that the uncompressed message can still be processed by the receiver.

An exemplary compression element 50 includes a processor 55 configured to compress an A11 message into a compressed message. The processor is configured to assign a first value to a first portion of a first octet of the compressed message based on a message type field of the A11 message. The first value corresponds to a value of the message type field. The first portion may be three bits in length.

The processor may also be configured to assign a second value to a second portion of the first octet of the compressed message based on a code field, a flags field and a status field of the A11 message. For example, the second value may correspond to a set of values for the code field, the flags field and the status field. The second portion may be five bits in length.

The following provides an overview of the compression element design for the A11 interface. The A11 interface message format is defined in the 3GPP2 standards document: A.S0017-D. Following the conventions of the 3GPP2 standard, bits are counted in each octet from the numeral zero (0), and octets are counted in each message from the numeral one (1).

There are eight types of A11 messages defined by the A11 interface standard as follows:
 A11-Registration-Request
 A11-Registration-Reply
 A11-Registration-Update
 A11-Registration-Acknowledge
 A11-Session-Update
 A11-Session-Update-Acknowledge
 A11-Capabilities-Info
 A11-Capabilities-Info-Ack As a result, the A11 Message Type may be specified in a compressed form by three or more bits, in an octet of a compressed message.

Each A11 message is composed of multiple Information Elements (IE) in a specific order defined by the standards. One of the IEs in an A11 message is the Message Type. The Message Type of an A11 message is found in the octet found at numerical position one.

Certain Information Elements appear in multiple A11 message types. There are two categories of information elements. One category is associated with the Information Element Identifier (IEI) coding which distinguishes one information element from another. The other category does not have an IEI associated with each information element, because each of these IEs has a fixed position in each defined A11 message type.

There are nine information elements without any IEI defined:
 A11 Message Type
 Care-of-Address
 Code
 Flags
 Home Address
 Home Agent
 Identification
 Lifetime
 Status These IEs have a fixed position in each defined A11 message of the standard.

There are five information elements each with a distinct Information Element Identifier (IEI) coding defined in the A11 message standard. FIG. 7 lists the A11 IEIs by name sorted by value. For example, the Mobile Home Authentication Extension IEI has a value of 20H. Since there are five IEs having a distinct IEI coding, the A11 IEI may be specified in a compressed form by three or more bits, in an octet of a compressed message. That is; three 3 bits are sufficient to specify IEI for information elements in this category.

Each original A11 message is composed of multiple Information Elements (IE) in a specific order established by the standards. An original A11 message is composed of a number of IE without IEIs followed by a number of IE with IEIs. The compressed A11 message is likewise, in one embodiment, comprised of a number of compressed IEs which include compressed IE without IEIs followed by compressed IE with IEIs. In other embodiments, IE without IEIs and IE with IEIs may be differently ordered so long as the compress and decompressor know the specific ordering of the compression scheme being utilized.

Compression for Information Elements without any IEI

In all of the eight A11 message types, A11-Message-Type is the first field and it occupies the first octet of every standard A11 message. Because 2^3=8, only three bits are necessary to indicate different message types in a compressed form. Thus, in one embodiment, a portion of the first octet of a compressed message can be utilized to uniquely identify an A11 message type. For example, bit 0, 1 and 2 of the first octet of a compressed message may be used to indicate A11 message types. FIG. 8a lists A11 interface message names sorted by A11 message type values of the first octet in each uncompressed message, followed by the values of the first three bits of the first octet in each compressed message according to an embodiment of the invention.

Not all A11 message formats have the Code or Flags or Status field. Any A11 message format has either one of the three fields mentioned above or none of them and thus, these fields are suitable for compression. The following are the list of A11 message formats with either Code or Flags or Status field, with the number of possible values of these fields in each type of A11 messages, ignoring the unused and reserved values, noted:
 A11-Registration-Request has a Flags field with two (2) possible values, which requires a minimum of one (1) bit to specify.
 A11-Registration-Reply has a Code field with eleven (11) possible values, which requires a minimum of four (4) bits to specify.
 A11-Registration-Acknowledge has a Status field with five (5) possible values which requires a minimum of three (3) bits to specify.
 A11-Session-Update-Acknowledge has a Status field with six (6) possible values which requires a minimum of three (3) bits to specify.

Accordingly, the remaining 8−3=5 bits of the first octet, after coding 3 bits for the Message Type, can be utilized to store the Code and Flags and Status field for A11 messages with such fields. These remaining bits can be filled with all zeros (0s) for A11 messages without any of the three fields: Code or Flags or Status. The bits alternatively may be filled with all ones (1) or some other fill value may be assigned to the set of five bits.

Consequently, the first octet of each compressed A11 message may be utilized to represent four fields: A11-Message-Type, Code, Flags and Status. Note that there are a total of twenty-five ((2+11+5+6)=24)) possible non-zero values of the Code, Flags and Status field, and there are five bits of design space which can accommodate 2^5=32 values. As a result, the combined Code-Flags-Status field may utilize the last five bits of the first octet without reusing the same values for different A11-Message-Type. Note also that values may be assigned to the Code-Flags-Status field in such a way that the resulting first octet does not have the same values as any of the uncompressed messages. Therefore, by decoding the first octet of an A11 message, it can readily be determined if the message is compressed or not. In other embodiment, the A11-Message-Type, Code, Flags and Status octet may be located in other than first position of the compressed message. FIG. 8b lists the values of Code, Flags and Status fields for different A11 message types followed by the value of the last five bits of the first octet in the compressed A11 message. Note that none of A11-Registration-Update, A11-Session-Update, A11-Cababilities-Info and A11-Capabilities-Info-Ack contains any of the three fields.

FIG. 8c lists the different values of the first octet in the compressed message representing A11-Message-Type, Code, Flags and Status fields of the uncompressed message. In the compressed message, the first octet may be referred to as the A11-Message-Type-Code-Flags-Status field. Essentially FIGS. 8*a* and 8*b* are merged to derive FIG. 8*c*. It should be noted that the set of values for the A11-Message-Type-Code-Flags-Status field in the compressed message does not intersect with the set of values for the A11-Message-Type field in the uncompressed message. Therefore, by examining the first octet of any A11 message (be it compressed or uncompressed), the entity receiving such a message be it the PDSN or the RNC/PCF, can decide whether to pass the message through the decompressor before the normal message processing.

The Home Address information element does not carry valid information for A11 interface and is ignored. However, the Home Address is included in every single A11 message and occupies four octets with value [00 00 00 00H]. Therefore, this information element can be removed (need not be expressed) in compressed messages. In addition to the information elements detailed above, certain octets of the standard A11 messages are reserved. For example, reserved octets appear in A11-Registration-Update messages. Accordingly, these reserved octets simply may be removed in the compressed messages. The compressor can refrain from specifying in the compressed message additional data that corresponds to another field of the A11 message when the another field has a fixed value for A11 messages of a first message type.

Compression Algorithms for Information Elements with IEI

Information elements identified with IEI follow the general Type-Length-Value structure. Accordingly, the decompressor would need the Length field to identify the end of the specific information element correctly. Therefore, the Length field must be updated reflecting the shortened size of the Value of the information element of the compressed form.

There are five information elements identified by IEI as the first octet of the information element as illustrated in FIG. 7. Since three (3) bits are enough to specify the IEI value, the first three bits of the first octet of each information element of this category may be utilized to map to the five EI values. The remaining 8−3=5 bits, after coding 3 bits for the IEI, may be utilized to specify different fields in each information element of this type. For information elements without any field to specify in the five bits, these individual bits or set of bits may simply be filled with a value, for example, be filled with all zeros. FIG. 9*a* lists the mapping of IEI to the first three bits of the first octet for the information element in the compressed messages. Without loss of generality, the value assigned to the first three bits is based on the complexity of the information elements to simplify the calculation of the value of the first octet. In principle, any assignment of distinct values to the first three bits is valid. FIG. 9*a* lists the IEI for each information element along with the first three bits of the first octet in its compressed form. Each IE associated with an IEI will now be addressed in turn.

Mobile-Home Authentication Extension

This information element appears in every A11-Registration-Request and A11-Registration-Reply message. The first octet of this information element stores A11-Element-Identifier (Type) and the second octet stores its Length as specified by the A11 message standards. The Type field has the fixed value of [20H] and the Length field has the fixed value of [14H]. The other two fields in this information element are Security-Parameter-Index (SPI) and Authenticator. Neither of these two fields can be compressed as they may have variable value for each A11 message.

As a result, the compressor may compress the first two octets into one octet by ignoring the Length field, using the first three (3) bits of the first octet to specify the IEI value, and filling the next five (5) bits of the first octet with for example, zeros. The compressor may refrain from specifying in the compressed information element additional data that corresponds to another field of the uncompressed information element when the another field has a fixed value for information elements having a IEI of a first value. FIG. 9*b* shows the first octet of this information element in its compressed form. FIG. 9*c* shows the specification of the original and compressed structure of the Mobile-Home Authentication Extension Information Element. The 'Octet' column of FIG. 9*c* identifies the octet number in which each corresponding field is stored in the original structure (standard A11 message) and compressed structure (compressed A11 message) according to an embodiment of the invention.

In order to compress the original structure, the Type field occupying the first octet and having a value [20H] is replaced with a value of [40H], the Length field occupying the second octet and having a value [14H] is deleted and the remainder of the information element is replicated in the compressed structure. Similarly, to decompress the compressed structure, the Type field occupying the first octet of value [40H] is replaced with [20H], the Length field in the second octet is inserted with value [14H], and the remainder of the information element is replicated in the uncompressed structure. The Mobile-Home Authentication Extension information element occupies twenty-two (22) octets in the original form and twenty-one (21) octets in the compressed form, resulting in bandwidth saving of $\frac{1}{22}$.

Registration Update Authentication Extension

This information element appears in every A11-Registration-Update, A11-Registration-Acknowledge, A11-Session-Update, A11-Session-Update-Acknowledge, A11-Capabilities-Info and A11-Capabilities-Info-Ack message. The first octet of this information element stores A11-Element-Identifier (Type) and the second octet stores its Length as specified by the A11 message standards. The Type field has the fixed value of [28H] and the Length field has the fixed value of [14H]. The other two fields in this information element are Security-Parameter-Index (SPI) and Authenticator. Neither of these two fields can be compressed.

As a result, the compressor may compress the first two octets into one octet by ignoring the Length field, using the first three (3) bits of the first octet to specify the IEI value, and filling the next five (5) bits of the first octet with for example, zeros. FIG. 10*a* shows the first octet of this information element in its compressed form. FIG. 10*b* shows the specification of the original and compressed structure of the Registration Update Authentication Extension information element.

In order to compress the original structure, the Type field occupying the first octet and having a value [28H] is replaced with a value of [60H], the Length field occupying the second octet and having a value [14H] is deleted and the remainder of the information element is replicated in the compressed structure. Similarly, to decompress the compressed structure, the Type field occupying the first octet of value [60H] is replaced with [28H], the Length field in the second octet is inserted with value [14H], and the remainder of the information element is replicated in the uncompressed structure. The Registration Update Authentication Extension information element occupies twenty-two (22) octets in the original form and twenty-one (21) octets in the compressed form, resulting in bandwidth saving of $\frac{1}{22}$.

Session Specific Extension

FIG. 11*a* shows the first octet of the Session Specific Extension information element in its compressed form. FIG. 11*b* shows the specification of the original and compressed structure of this information element. This Session Specific Extension information element appears in all A11-Registration-Request, A11-Registration-Reply, A11-Registration-Update, A11-Registration-Acknowledge, A11-Session-Update, and A11-Session-Update-Acknowledge messages. As specified in by the A11 message standard, the first octet of this information element stores A11-Element-Identifier (Type) with the value of [27H]. In the compressed form, the first three bits of the first octet may be used to represent A11-Element-Identifier (Type) leaving the remaining five bits to be used for other fields. The Protocol-Type field occupies two octets, and has a fixed value of [88 81H] for all uncompressed messages. Thus, this field may be skipped (i.e., not expressed) in the compressed form. There are 8+6=14 reserved bits in this IE, and these reserved bits can skipped without specifying in the compressed IE additional data that corresponds to this field.

The Session-ID field occupies two bits, but only has two values ("0" and "1") and thus, may be represented by a single bit in the compressed structure. For example, bit three of the first octet in the compressed structure may be used to represent this field. The field MN-Session Reference-ID occupies two octets, but only has six possible values for all messages [00 01H-00 06H], and therefore can be represented with one octet in the compressed message structure. The field MSID-Type occupies two octets, but only has two possible non-reserved values for all messages [00 00 H or 00 06H], and therefore can be represented using a single bit, for example, bit four in the first octet in the compressed structure.

The Length field specifies the number of octets in this information element following this Length field and occupies octet two of the information element. The MSID-Length field specifies the number of octets in this uncompressed A11 information element following the field occupying octet fifteen. Naturally, MSID Length=Length−13. And so, MSID-Length field need not be included in the compressed form, saving another octet. In the compressed form of this element, the first octet may be referred to as the Element-ID-Session-ID-MSID-Type field. To summarize, for the entire information element structure, a total of eight (2+2+1+2+1=8) octets are saved in its compressed form.

In order to compress the original structure, the following methodology is employed:

Replace the Type field occupying the first octet of value [27H] with [00H, 08H, 10H, 18H] according to Table 11a.
Update the second field Length occupying the second octet with value Length−8.
Delete the Protocol-Type field occupying octet 3 and 4.
Keep the Key field occupying octet 5 to 8.
Delete the Reserved field and Session-ID-Ver field occupying octet 9 and 10.
Delete the first octet of the MS-Session-Reference-ID field occupying octet 11 and 12 so the resulting field occupies octet 11.
Delete the MSID-Type field.
Delete the MSID-Length field.
Keep the MSID-Details field.

In order to decompress the compressed structure, the following methodology is employed:

Replace the Type field occupying the first octet with value [27H]. Based on the compressed Type field [00H, 08H, 10H, 18H], retrieve Session-ID-Ver and MSID-Type field according to Table 11a.
Update the second field Length occupying the second octet with value Length+8.
Insert the Protocol-Type field with value [88 81H] to octet 3 and 4.
Keep the Key field in octet 5 to 8.
Insert the Reserved field and Session-ID-Ver field to octet 9 and 10.
Insert one octet with value [00] in front of the MS-Session-Reference-ID field so this field occupies two octets, 11 and 12.
Insert the MSID-Type field to octet 13 and 14.
Insert the MSID-Length field to octet 15 with value Length−13.
Keep the MSID-Details field.

The Session Specific Extension information element occupies Ks octets in the original form and Ks−8 octets in the compressed form, resulting in bandwidth saving of 8/Ks. In practice, it can be observed that Ks=23 in all the message formats that contain this information element, which means the bandwidth saving in practice is 8/23.

Critical Vendor/Organization Specific Extension (CVSE)

This information element may be present in A11-Registration-Request and A11-Registration-Reply messages. As with other elements, the first octet of the uncompressed information element specifies A11-Element-Identifier which will be represented by the first three bits of the first octet in the compressed form, leaving the remaining five bits of the first octet to be used for other fields. The second octet is reserved, and can be removed from the compressed form. The field 3GPP2-Vendor-ID occupies four octets and remains the same value of [00 00 15 9FH] for all A11 messages. As a result, an indicator of this field can be removed in the compressed form.

The field Application-Type occupies one octet, but only has three possible non-reserved values [01H], [02H], and [03H]. Since two bits are sufficient to represent three values, a portion of the first octet of the compressed form of this IE can be utilized to represent this field. For example, bit 3 and bit 4 of the first octet of this compressed IE may be used to represent this field. The field Application-Sub-Type occupies one octet, and only has one value used [01H] in practice. According, this field need not be replicated in the compressed form of this IE. The first octet of this compressed structure may be referred to as Element-ID-Application-Type field. In summary, by shifting fields and skipping fields with fixed values, seven (1+4+1+1=7) octets are saved by compression from the high level structure of this information element. FIG. 12*a* shows the first octet of the Critical Vendor/Organization Specific Extension information element in its compressed form. FIG. 12*b* shows the specification of the original and compressed top level structure of the CVSE information element.

Each Critical Vendor/Organization Specific Extension information element contains exactly one Application-Type and one Application-Sub-Type. When Application-Type is Mobility-Event-Indicator (with Type value=[02H]) or Data-Available-Indicator (with Type value=[03H]), the Application-Data field is empty. Because of this, for these two Application-Types, the Length field has a fixed value of [00 06H], therefore it can be skipped in the compressed structure saving an extra two octets. Since the other fields of these IE also have fixed values, the compressor may utilize a single octet for the compressed form of these particular information elements.

FIG. 12*c* shows the specification of the original and compressed top level structure of the Critical Vendor/Organization Specific Extension with Application Type Mobility Event Indicator. FIG. 12*d* shows the specification of the original and compressed top level structure of the Critical Vendor/Organization Specific Extension with Application Type Data Availability Indicator. As shown in FIG. 12*c*, the original structure of the CVSE with Application Type Mobility Event Indicator includes an A11-Element-Identifier field occupying the first octet and having a value of [26H], a Reserved field occupying the second octet and having a value of [00H], Length field occupying two octets (the third and fourth octets) and having a value of [00 06H], a 3GPP2-Vendor-ID field occupying four octets (the fifth through eighth octets) and having a value of [00 00 15 9FH], an Application-Type field occupying the ninth octet and having a value of [02H], an Application-Sub-Type field occupying the tenth octet and having a value of [00H]. In the compressed form, the CVSE with Application Type Mobility Event Indicator is represented by a single Element-ID-Application-Type Field of a single octet having a value of [30H].

In order to compress the original structure of these CVSE IEs, the following methodology is employed based on the Application Type Field:
- Replace the Type field occupying the first octet of value [26H] with [30H] when the Application-Type=[02H] and with [38H] when the Application-Type=[03H].
- Delete the reminder of the uncompressed information element to form the compressed information element.

In order to compress the original structure, the following methodology is employed based on the Application Type Field:
- Replace the Type field occupying the first octet of value [30H] or [38H] with value [26H].
- Insert the Reserved field of value [00H] to octet 2.
- Insert the Length field of value [00 06H] to octet 3 to 4.
- Insert the 3GPP2-Vendor-ID field of value [00 00 15 9FH] to octet 5 to 8.
- Insert the Application-Type field to octet 9 with a value [02H] when the first octet of the compressed IE had a value of [30H] and with a value [03H] when the first octet of the compressed IE had a value of [38H].
- Insert the Application-Sub-Type field of value [01H] to octet 10.

The compression of the CVSE information element with Application-Type=[02H] (i.e., with Mobility Event Indicator) or [03H] (i.e., with Data Availability Indicator) occupies ten octets in the original form and one octet in the compressed form, resulting in bandwidth saving of 9/10.

For a CVSE information element with Application Type Accounting, that is when Application-Type is Accounting (with Type value=[01H]), the Application-Data field normally contain multiple Accounting Parameters. Each Accounting Parameter in the Application-Data field specified in A11 message standard contains the following fields with certain characteristics:
- Type occupies the first octet, and has two possible values [1AH, 1FH]. Therefore, one bit is sufficient to represent this field in the compressed structure.
- Length: occupies the second octet.
- 3GPP2-Vender-Id: occupies 4 octets and has a fixed value of [00 00 15 9FH].
- Vendor-Type: occupies 1 octet, and has 28 possible values as specified in A11 message standard. The following are the possible values: 9, 10, 11, 12, 13, 16, 17, 18, 19, 20, 21, 32, 33, 39, 40, 41, 42, 45, 49, 50, 52, 83, 84, 85, 86, 87, 114 and 116. Since 2^7=128>116, 7 bits are sufficient to represent any value in this range specified.
- Vendor-Length: occupies one octet, and has a fixed relationship with Length as follows. Vendor-Length= (Length−6). The six octets account for the three preceding fields: Length, 3GPP2-Vender-ID and Vendor-Type.
- Vendor-Value: has variable size.

Based on the property of these fields of each Accounting Parameter, the Type and Vendor-Type field can be merged into the first octet by using a first bit to represent the Type field and the remaining seven bits to represent Vendor-Type field. This compression leads to a saving of one octet between uncompressed and compressed structures. FIG. 13a lists the structure for the first octet of the Accounting Parameter within the Application-Data field of Critical Vendor/Organization Specific Extension (CVSE) Information Element. The 3GPP2-Vender-Id field and Vendor-Length field have fixed values and/or fixed relations to other fields and thus need not be compressed resulting in savings of another five (4+1=5) octets. As a result, a total of six octets can be saved from each Accounting Parameter before examining the Vendor-Value field.

Upon examining the details of the Accounting Parameters specified in the A11 message standards, the format used to represent the values is revealed to be highly inefficient. For example, with Type=[26], Sub-Type=[40], there are only four possible values to specify Airlink-Record-Type: 1 is for SETUP, 2 is for START, 3 is for STOP and 4 is for SDB. Instead of using four octets to store the four values, one octet can be use in the compressed form. Following the same principle, most of the payload sizes can be shrunk from four octets to one octet. Another parameter, User-Zone is either set to [00 00 00 00H] using four octets or not included. Again one octet with value [00H] can be used when this parameter is included in the IE. Without loss of generality, one can assume that P octets can be saved by compressing the Vendor-Value field, where P is an integer. Note that each Vendor-Value will be associated with a value P as the compression scheme for different Vendor-Value varies based on possible values used in practice. FIG. 13a lists a few Vendor-Values with their original and compressed lengths. Note that this table is not complete, but can be extended to all fields used in practice. By default, Vendor-Values not included in this table, which may be consulted by the compressor during compression in one embodiment of the invention, will not be compressed. That is, by default, Vendor-Values unknown to the compressor will not be compressed. FIG. 13c specifies the original and compressed structure for the Accounting Parameter within the Application-Data field of the Critical Vendor/Organization Specific Extension (CVSE) information element, assuming the Vendor-Value field can be compressed by P octets, where P is an integer. Note with respect with to the Type field of original structure in FIG. 13c that [1AH, 1FH] indicates that the type may have one of two values, namely [1AH] or [1FH].

Assume the Vendor-Value field can be compressed by reducing P octets; in order to compress and decompress Accounting Parameters within the CVSE Application-Data field the following methodology is employed:
- To compress accounting parameters:
  - Update the Type field the first octet of value [1AH, 1FH] based on FIG. 13a.
    - If Type=[1AH], then update Type with Vendor-Type value.
    - If Type=[1FH], then update Type with (128+Vendor-Type value).
  - Retrieve P according to FIG. 13b based on Type and Vendor-Type.
  - Update the Length field with value (Length−6−P).
  - Delete the 3GPP2-Vendor-ID field.
  - Delete the Vendor-Type field.
  - Delete the Vendor-Length field.
  - Update the Vendor-Value field based on the compression scheme for different types of Vendor-Value field.
- To decompress Accounting Parameters with Length Kc−6−P:

Retrieve value for the field Type and Vendor-Type from the Type-Vendor-Type field occupying the first octet based on FIG. 13a.
Based on Type and Vendor-Type, retrieve P from FIG. 13b.
Replace the first octet with Type value of [1AH, 1FH].
Update the Length field with value (Length+6+P) in octet 2.
Insert the 3GPP2-Vendor-ID field of value [00 00 15 9FH] to octet 3 to 6.
Insert the Vendor-Type field to octet 7.
Insert the Vendor-Length field with value (Length−6) to octet 8.
Insert the decompressed Vendor-Value field to octet 9 to Kc.

Each Accounting parameter within a CVSE information element occupies Kc octets in the original form and Kc−6−P octets in the compressed form, resulting in bandwidth saving of (6+P)/Kc.

Similarly, the following methodology is utilized to compress and decompress CVSE information element with Application-Type Accounting:
To compress:
Replace the Type field occupying the first octet of value [26H] with [28H]
Delete the Reserved field occupying octet 2.
Move the Length field in octet 2.
Delete the 3GPP2-Vender-ID field.
Delete the Application-Type field.
For each Accounting-Parameter i, apply the Compression Algorithm for Accounting Parameters resulting in saving of Qi octets.
Update the Length field in octet 2 to 3 with (Length−7−$sum_i(Qi)$).
To decompress:
Replace the Type field occupying the first octet of value [28H] with value [26H].
Insert the Reserved field of value [00H] to octet 2.
Move the Length field to octet 3 to 4.
Insert the 3GPP2-Vendor-ID field of value [00 00 15 9FH] to octet 5 to 8.
Insert the Application-Type field of value [01H] to octet 9.
Insert the Application-Sub-Type field of value [01H] to octet 10.
For each Accounting Parameter i, apply the Decompression Algorithm for Accounting Parameters resulting in recovery of Qi octets.
Update the Length filed in octet 3 to 4 with (Length+7+$sum_i(Qi)$).

The CVSE information element with Application-Type= [01H] occupies Kc octets in the original form and Kc−7−$sum_i$(Qi) octet in the compressed form, resulting in bandwidth saving of (7+$sum_i(Qi)$)/Kc.

Normal Vendor/Organization Specific Extension (NVSE)

This information element may appear in the A11-Registration-Request, A11-Registration-Reply, A11-Registration-Update, A11-Session Update, A11-Capabilities-Info, and A11-Capabilities-Info-Ack messages. As with other elements, the first octet of the uncompressed form defined by the A11 message standards specifies A11-Element-Identifier which will be represented by the first three bits of the first octet in the compressed form, leaving the remaining five bits of the first octet to be used for other fields. The third and fourth octets are reserved, and can be removed in the compressed form. The field 3GPP2-Vendor-ID occupies four octets and has the fixed value of [00 00 15 9FH]. As a result, this field can be removed in the compressed form. The field Application-Type occupies one octet, but only has eight possible non-reserved values [04H, 05H, 06H, 07H, 08H, 09H, 0AH, and 0BH]. Even through three bits are sufficient to represent 8 values, to preserve the range of the values from [04H] to [0BH], the last 4 bits of the first octet may be used to represent this field. The field Application-Sub-Type occupies one octet, and only has two un-reserved values, [01H] and [02H]. Therefore a single bit, for instance, bit 3 of the first octet can be used to represent the Application-Sub-Type. The first octet of the compressed structure for this IE may be referred to as the Element-ID-Application-Type-Sub-Type field. FIG. 14a lists the structure for the first octet of the Normal Vendor/Organization Specific Extension (NVSE) information element in its compressed form. Note that values unspecified will not appear in the original format, and therefore it is not necessary to consider the compressed forms of these combination of values of Application-Type and Application-Sub-Type.

In summary, by shifting fields and skipping fields with fixed values, eight (2+4+1+1=8) octets can be saved from the beginning part of this information element before reaching the Application-Data field. The details of the original and compressed structure of the information element are in detailed in FIG. 14b, which specifies the original and compressed structure of this information element assuming P octets can be saved from the Application-Data field.

Upon examining the details of the Application Data field specified in the A11 message standards, the format used to represent the values is revealed to be highly inefficient. For example, there are three values specified for Service-Option, and this field occupies two octets. Accordingly, certain values are compressed according to embodiments of the invention. The mapping in FIG. 15, which lists the original and compressed structure for Service-Option Value in Application-Data field of Normal Vendor/Organization Specific Extension (NVSE) Information Element, can be utilized to reduce the space needed store such information in the compressed structure, for example, to one octet in order to preserve octet boundary.

The following methodology is utilized to compress and decompress NVSE information element:
To compress NVSE assuming P octets can be saved from the Application-Data field:
Replace the Type field occupying the first octet of value [86H] with [85H, 86H, 87H, 88H, 89H, 8AH, 9AH, 8BH, 9BH] based on Application-Type and Application-Sub-Type using FIG. 14a.
Delete the Reserved field occupying octet 3 to 4.
Delete the 3GPP2-Vender-ID field occupying octet 5 to 8.
Delete the Application-Type field occupying octet 9.
Delete the Application-Sub-Type field occupying octet 10.
Update the Application-Data field using the compressed form if possible, resulting in saving of P octets.
Update the Length field in octet 2 with (Length−8−P).
To decompress NVSE assuming P octets are saved from the Application-Data field in the compressed form:
Replace the Type field occupying the first octet with value [86H]. Based on the compressed Type field [85H, 86H, 87H, 88H, 89H, 8AH, 9AH, 8BH, 9BH], retrieve Application-Type and Application-Sub-Type field according to FIG. 14a.
Insert the Reserved field of value [00 00H] to octet 3 to 4.
Insert the 3GPP2-Vendor-ID field of value [00 00 15 9FH] to octet 5 to 8.
Insert the Application-Type field to octet 9.
Insert the Application-Sub-Type field to octet 10.
Decompress Application-Data field if it is compressed, resulting in expansion of P octets.

Update the Length filed in octet 2 with (Length+8+P).

The NVSE information element occupies Kn octets in the original uncompressed form and Kn−8−P octets in the compressed form, resulting in bandwidth saving of (8+P)/Kn.

Thus, it is apparent that the compressor can be configured to assign a third value to a third portion of a second octet of the compressed message based on an information element identifier of the A11 message. For example, the third value of the third portion of the second octet corresponds to a value of the information element identifier. The processor may also be configured to assign a fourth value to a fourth portion of the second octet of the compressed message based on one of (i) a session identification version field and a Mobile Station ID (MSID) type field, (ii) an application type, or (iii) an application type field and an application sub-type field of the A11 message. In this instance, the use of the numerical identifiers first, second, etc. is provided merely for the convenience of the reader so as to uniquely identify the item of interest and does not denote a specific location in the A11 message. However, to compress and decompress, the compression element must know the specific compression scheme being utilized such that the location of compressed message type and information element identifier information can be recognized.

By applying the compression methodologies for individual information elements presented above, the compressed message formats for different A11 message types can be derived. It is noted that each A11 message is composed of multiple Information Elements (IE) in a specific order defined by the A11 message standards. Utilizing the compression provided herein, significant bandwidth savings are enabled for various message types. FIG. 16, which comprises FIGS. 16a, 16b, and 16c compares the original and compressed A11-Registration-Request message format based on the original message format specified by the A11 message standards. A11 possible values for each field of the message are given. The figures are understood in a fashion similar to how each constituent information element is understood, as previously described. FIGS. 17 and 18 list the original size of the message and the reduction in size after compression based on different CVSE Values. In particular, FIG. 17 specifies bandwidth savings for an A11-Registration-Request Message where the CVSE is for Mobility Event Indicator or Data Availability Indicator and the A11 message is compressed according to one embodiment of the invention. Similarly, FIG. 18 specifies bandwidth savings for A11-Registration-Request Message where the CVSE is for Accounting and the A11 message is compressed according to one embodiment of the invention.

It will be readily apparent how other A11 messages may be compressed and the bandwidth savings provided by various embodiments of the invention using the Figures detailing constituent information elements. The compression element according to the invention is generic and applicable to various cellular networks such as CDMA2000, UMTS, LTE etc.

The methods described above are readily carried out by special purpose devices, such as network elements, routers and interfaces, and by special or general purpose digital information processing devices acting under appropriate instructions embodied, e.g., in software, firmware, or hardware programming. For example, functional modules of the compression element, interfaces, compressor, decompressor and other logic circuits can be implemented as an ASIC (Application Specific Integrated Circuit) constructed with semiconductor technology. Alternatively, various modules may be implemented with FPGA (Field Programmable Gate Arrays) and other hardware blocks. As such, the process steps described herein are intended to be broadly interpreted as capable of being equivalently performed by software, hardware and a combination thereof in various alternative embodiments.

What is claimed is:

1. An apparatus comprising:
a memory device and an associated processor of a network node, the processor configured to compress an A11 message into a compressed message;
wherein said processor is configured to assign a first value to a first portion of a first octet of the compressed message based on a message type field of the A11 message.

2. The apparatus of claim 1 wherein the first value of the first portion of the first octet corresponds to a value of the message type field.

3. The apparatus of claim 1 wherein the first portion is three bits in length.

4. The apparatus of claim 1 wherein said processor is configured to assign a second value to a second portion of the first octet of the compressed message based on a code field, a flags field and a status field of the A11 message.

5. The apparatus of claim 4 wherein the second value of the second portion of the first octet corresponds to a set of values for the code field, the flags field and the status field.

6. The apparatus of claim 4 wherein the second portion is five bits in length.

7. The apparatus of claim 1 wherein said processor is configured to assign a third value to a third portion of a second octet of the compressed message based on an information element identifier of the A11 message.

8. The apparatus of claim 7 wherein the third value of the third portion of the second octet corresponds to a value of the information element identifier.

9. The apparatus of claim 7 wherein said processor is configured to assigning a fourth value to a fourth portion of the second octet of the compressed message based on one of
a session identification version field and a Mobile Station ID (MSID) type field,
an application type, or
an application type field and an application sub-type field of the A11 message.

10. The apparatus of claim 1 wherein said processor is configured to refrain from specifying in the compressed message additional data that corresponds to another field of the A11 message when the another field has a fixed value for A11 messages of a first message type.

11. The apparatus of claim 1 wherein said processor is configured to specify in the compressed message data that corresponds to another field of the A11 message when the another field has a variable value for A11 messages of a first message type.

12. The apparatus of claim 11 wherein said processor is configured to set a value of a length field in the compressed message so as to reflect adjustment in length of an information element of the compressed message from that of a corresponding information element of the A11 message.

13. The apparatus of claim 1 wherein the processor is configure to compress the A11 message in the event the A11 message is directed to a network element capable of decompressing a compressed message.

14. The apparatus of claim 13 further comprising
a memory indicating a plurality of network elements capable of decompressing a compressed message.

15. A method comprising
compressing by a processor at a first network element an A11 message destined for a second network element into a compressed message;
wherein said compressing comprises
assigning a first portion of a first octet of the compressed message a first value based on a message type field of the A11 message.

16. The method of claim 15 wherein said compressing further comprises
assigning a second portion of the first octet of the compressed message a second value based on a code field, a flags field and a status field of the A11 message.

17. The method of claim 16 wherein said compressing further comprises
assigning a third portion of a second octet of the compressed message a third value based on an information element identifier of the A11 message.

18. The method of claim 17 wherein said compressing further comprises
assigning a fourth portion of the second octet of the compressed message a fourth value based on one of
a session identification version field and a Mobile Station ID (MSID) type field,
an application type, or
an application type field and an application sub-type field of the A11 message.

19. The method of claim 18 wherein said compressing further comprises
specifying in the compressed message data that corresponds to another field of the A11 message when the another field has a variable value for A11 messages of a first message type.

20. The method of claim 15 wherein the compressing is based on an determination of whether the second network element is capable of decompressing a compressed A11 message.

* * * * *